(12) United States Patent
Zhang

(10) Patent No.: US 12,256,530 B2
(45) Date of Patent: Mar. 18, 2025

(54) METHOD OF MANUFACTURING SEMICONDUCTOR STRUCTURE, SEMICONDUCTOR STRUCTURE AND MEMORY

(71) Applicant: CHANGXIN MEMORY TECHNOLOGIES, INC., Hefei (CN)

(72) Inventor: Kui Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 449 days.

(21) Appl. No.: 17/663,871

(22) Filed: May 18, 2022

(65) Prior Publication Data
US 2023/0147028 A1    May 11, 2023

(30) Foreign Application Priority Data
Nov. 8, 2021    (CN) .......................... 202111314977.7

(51) Int. Cl.
*H10B 12/00*    (2023.01)

(52) U.S. Cl.
CPC ....... *H10B 12/0387* (2023.02); *H10B 12/312* (2023.02); *H10B 12/482* (2023.02)

(58) Field of Classification Search
CPC . H10B 12/0387; H10B 12/482; H10B 12/312
See application file for complete search history.

(56) References Cited

U.S. PATENT DOCUMENTS

| | | | |
|---|---|---|---|
| 10,896,909 B2 | 1/2021 | Ujihara et al. | |
| 11,522,048 B2 | 12/2022 | Bomberger et al. | |
| 11,587,949 B1* | 2/2023 | Guo | H10B 41/30 |
| 11,637,189 B1* | 4/2023 | Shao | H10B 12/488 |
| | | | 257/401 |
| 2011/0051527 A1* | 3/2011 | Kirisawa | H10B 43/27 |
| | | | 365/185.29 |
| 2023/0413518 A1* | 12/2023 | Kim | H10B 12/05 |
| 2024/0057319 A1* | 2/2024 | Shin | H10B 12/05 |
| 2024/0224495 A1* | 7/2024 | Kim | H10B 12/05 |

FOREIGN PATENT DOCUMENTS

| | | |
|---|---|---|
| CN | 111542924 A | 8/2020 |
| CN | 111725301 A | 9/2020 |
| CN | 112563268 A | 3/2021 |

* cited by examiner

*Primary Examiner* — Christine A Enad
(74) *Attorney, Agent, or Firm* — Kilpatrick Townsend & Stockton LLP

(57) ABSTRACT

Embodiments of the present disclosure relate to the field of semiconductors, and in particular to a method of manufacturing a semiconductor structure, a semiconductor structure and a memory. The method of manufacturing a semiconductor structure includes: forming a first semiconductor layer on a substrate, the first semiconductor layer including a first trench region and a to-be-doped region on two opposite sides of the first trench region; forming a word line, the word line surrounding a sidewall surface of a part of the first semiconductor layer in the first trench region, and at least a part of a projection of a part of the first semiconductor layer in the to-be-doped region on a surface of the substrate coinciding with a projection of the word line on the surface of the substrate; forming a doping body portion, the doping body portion including first dopant ions.

18 Claims, 12 Drawing Sheets

METHOD OF MANUFACTURING SEMICONDUCTOR STRUCTURE, SEMICONDUCTOR STRUCTURE AND MEMORY

CROSS-REFERENCE TO RELATED APPLICATIONS

This application claims the priority of Chinese Patent Application No. 202111314977.7, submitted to the Chinese Intellectual Property Office on Nov. 8, 2021, the disclosure of which is incorporated herein in its entirety by reference.

TECHNICAL FIELD

Embodiments of the present disclosure relate to the field of semiconductors, and in particular to a method of manufacturing a semiconductor structure, a semiconductor structure and a memory.

BACKGROUND

The memory is a common semiconductor structure. While the semiconductor structure is getting smaller, more memories can be integrated on a chip to increase the capacity of a product. There are a plurality of small conductive cells in the semiconductor structure, such as a gate, a bit line (BL), a source and a drain. The gate is configured to form a conductive trench between the source and the drain to turn on the source and the drain. With the decreased size of the semiconductor structure, it is increasingly important to optimize the performance of the conductive cells in the semiconductor structure.

However, the gate has the undesirable controllability at present.

SUMMARY

According to an aspect, an embodiment of the present disclosure provides a method of manufacturing a semiconductor structure, including: providing a substrate; forming a first semiconductor layer on the substrate, wherein the first semiconductor layer comprises a first trench region and a to-be-doped region on two opposite sides of the first trench region, and the first trench region and the to-be-doped region are arranged in a direction parallel to a surface of the substrate; forming a word line (WL), wherein the word line surrounds a sidewall surface of a part of the first semiconductor layer in the first trench region, and at least a part of a projection of a part of the first semiconductor layer in the to-be-doped region on the surface of the substrate coincides with a projection of the word line on the surface of the substrate; forming a doping body portion, wherein the doping body portion comprises first dopant ions, and the doping body portion contacts an end surface of the to-be-doped region away from the first trench region; and performing an annealing, such that the first dopant ions diffuse to the to-be-doped region, the to-be-doped region is converted into a doped region, and along a direction that the doped region points to the first trench region, a concentration of dopant ions in the doped region is decreased progressively.

Accordingly, an embodiment of the present disclosure further provides a semiconductor structure, including: a substrate; a first semiconductor layer, located on the substrate, and comprising a first trench region and a doped region on two opposite sides of the first trench region, the first trench region and the doped region being arranged in a direction parallel to a surface of the substrate, and along a direction of the doped region points to the first trench region, a concentration of dopant ions in the doped region being decreased progressively; and a word line, surrounding a sidewall surface of a part of the first semiconductor layer in the first trench region, and at least a part of a projection of a part of the first semiconductor layer in the doped region on the surface of the substrate coinciding with a projection of the word line on the surface of the substrate.

Accordingly, an embodiment of the present disclosure further provides a memory, including the semiconductor structure described above.

BRIEF DESCRIPTION OF THE DRAWINGS

One or more embodiments are exemplified by corresponding drawings, and these exemplified descriptions do not constitute a limitation on the embodiments. The drawings are not limited by scale unless otherwise specified.

DETAILED DESCRIPTION

Figure 1:
FIG. 1 to FIG. 4 each are a structural view corresponding to formation of a first semiconductor layer, a second semiconductor layer and a third semiconductor layer in a method of manufacturing a semiconductor structure according to an embodiment of the present disclosure.

According to the background art, the gate has the undesirable controllability in the prior art.

Through analysis, a doped region of the semiconductor structure at present is usually formed by vertically doping a substrate of the semiconductor structure, which causes the undesirable controllability of the gate. When the substrate is vertically doped, only the to-be-doped surface of the substrate is doped, such that the doped region is formed corresponding to the to-be-doped surface on the substrate. However, while the semiconductor is getting smaller, there is a smaller size of the substrate, a smaller area of the to-be-doped surface, and a smaller operating space. As a result, the doping process is implemented more difficultly, and the doping concentration of the substrate in the vertical direction is controlled undesirably, to affect the controllability of the gate.

An embodiment of the present disclosure provides a method of manufacturing a semiconductor structure, including: A first semiconductor layer comprising a first trench region and a to-be-doped region on two opposite sides of the first trench region is formed on a substrate. A WL is formed. The WL surrounds a sidewall surface of a part of the first semiconductor layer in the first trench region. Therefore, the contact area between the WL and the sidewall surface of the part of the first semiconductor layer in the first trench region is larger and the trench in the semiconductor structure is longer to reduce the threshold voltage of the gate and achieve the better controllability of the gate. A doping body portion is formed. The doping body portion comprises first dopant ions, and the doping body portion contacts an end surface of the to-be-doped region away from the first trench region. Annealing is performed, such that the first dopant ions diffuse to the to-be-doped region, the to-be-doped region is converted into a doped region, and along a direction that the doped region points to the first trench region, a concentration of dopant ions in the doped region is decreased progressively. That is, the doping body portion horizontally dopes the to-be-doped region on the two sides of the first semiconductor layer. As the end surfaces on the two sides of the first semiconductor layer are exposed to the outside, the horizontal doping on the first semiconductor layer can provide a larger operating space than the vertical doping on the substrate for forming the doped region, and thus the doping concentration is easily controlled and the better controllability of the gate is achieved. In addition, in the direction that the doped region points to the first trench region, the concentration of the dopant ions in the doped region is decreased progressively, so the enhanced electric field when the gate is turned on has less influence on most dopant ions in the doped region, thereby avoiding current leakage of the doped region due to the strong electric field and achieving the better controllability of the gate.

The embodiments of the present disclosure are described in detail below with reference to the drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 2:
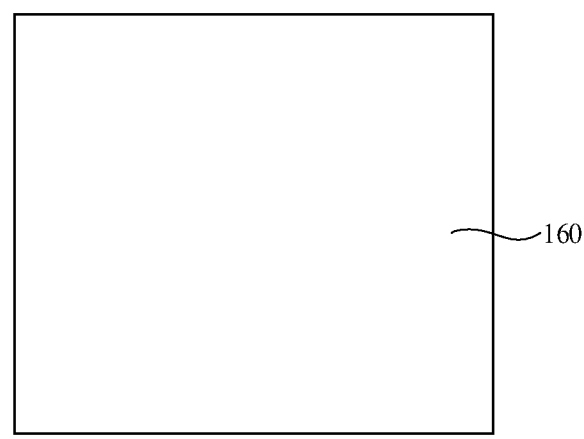

FIG. 1 is a front sectional view corresponding to formation of a first semiconductor layer, a second semiconductor layer and a third semiconductor layer in a method of manufacturing a semiconductor structure according to an embodiment of the present disclosure. FIG. 2 is a top view corresponding to formation of a first semiconductor layer, a second semiconductor layer and a third semiconductor layer in a method of manufacturing a semiconductor structure according to an embodiment of the present disclosure.

Referring to FIG. 1 and FIG. 2, a substrate 100 is provided. A first semiconductor layer 110 is formed on the substrate 100. The first semiconductor layer 110 is provided with a first trench region 111 and a to-be-doped region 112 on two opposite sides of the first trench region 111. The first trench region 111 and the to-be-doped region 112 are arranged in a direction parallel to a surface of the substrate 100. The to-be-doped region 112 is located on the two sides of the first trench region 111, such that two ends of the to-be-doped region 112 away from the first trench region 111 can be exposed. When the to-be-doped region 112 is doped subsequently in a horizontal direction, whole exposed end surfaces of the to-be-doped region 112 can be doped to obtain a larger doping area, namely a larger doping space is provided for the doping process to better control the doping concentration in the to-be-doped region 112.

The substrate 100 is made of a semiconductor material. In some embodiments, the substrate 100 is made of silicon. In other embodiments, the substrate 100 may also be a germanium substrate, a germanium-silicon substrate, a silicon carbide substrate or a silicon-on-insulator (SOI) substrate.

In some embodiments, at least two spaced first semiconductor layers 110 may be formed on the substrate 100 to subsequently form a plurality of spaced WLs.

In some embodiments, the first semiconductor layer 110 is formed as:

A first preliminary semiconductor layer 110 is formed with a deposition process. Specifically, the first semiconductor layer 110 and the substrate 100 may be made of a same material. In some embodiments, the first preliminary semiconductor layer 110 may be made of silicon. In other embodiments, the preliminary semiconductor layer may also be made of germanium, germanium-silicon, silicon carbide substrate or SOI.

The first preliminary semiconductor layer 110 is doped to form the first semiconductor layer 110. In some embodiments, the first semiconductor layer 110 may be doped with either ion implantation or thermal diffusion. Specifically, in some embodiments, P-type ions may be doped in the first preliminary semiconductor layer 110. In other embodiments, N-type ions may also be doped in the first preliminary semiconductor layer 110. The N-type ions are at least one of arsenic ions, phosphorus ions or antimony ions, and the P-type ions are at least one of boron ions, indium ions or gallium ions.

In some embodiments, the method of manufacturing a semiconductor structure further includes: A first sacrificial layer 151 and a second sacrificial layer are formed. The first sacrificial layer 151 is located on a surface of the first semiconductor layer 110 close to the substrate 100, and the second sacrificial layer 152 is located on a surface of the first semiconductor layer 110 away from the substrate 100. Therefore, foundations are laid for subsequent formation of the WL around the first semiconductor layer 110, namely a part of the first sacrificial layer 151 and a part of the second sacrificial layer 152 can be removed subsequently to provide a space for formation of the WL. Specifically, in some embodiments, the first sacrificial layer 151 and the second sacrificial layer 152 may be separately deposited on the surface of the substrate 100 and the surface of the first semiconductor layer 110 away from the substrate 100. In some embodiments, the first sacrificial layer 151 and the second sacrificial layer 152 may be made of either a carbon material or a system on chip (SOC) material. In other embodiments, the sacrificial layers are made of at least one of low dielectric constant materials such as borosilicate glass (BSG), boro phosphosilicate glass (BPSG), tetraethyl orthosilicate (TEOS) or silicon oxide.

In some embodiments, the method of manufacturing a semiconductor structure further includes: A second semiconductor layer 120 and a third semiconductor layer 130 are sequentially formed on the substrate 100. The second semiconductor layer 120 and the third semiconductor layer 130 may be located on an upward side of the first semiconductor layer 110 away from the substrate 100. The WL surrounds a part of a sidewall surface of the second semiconductor layer 120 and a part of a sidewall surface of the third semiconductor layer 130. The first semiconductor layer 110, the second semiconductor layer 120 and the third semiconductor layer 130 comprise a same type of dopant ions. The second semiconductor layer 120 includes a second trench region and a doped region on two sides of the second trench region. The third semiconductor layer 130 includes a third trench region and a doped region on two sides of the third trench region. That is, there are three trenches in the semiconductor structure. When the voltage is applied to the gate, different trenches each can function as a conductive passage to achieve the better controllability of the gate. Specifically, the second semiconductor layer 120 and the third semiconductor layer 130 may be formed with a same process.

It will be understood that, in some embodiments, a doping concentration of the dopant ions in the first semiconductor layer 110, a doping concentration of the dopant ions in the second semiconductor layer 120 and a doping concentration of the dopant ions in the third semiconductor layer 130 may be equal. That is, when each of the trenches is turned on, a same threshold voltage is applied to form the conductive passage to turn on the source and the drain. If one of the trenches does not work, the source and the drain may be turned on by other trenches and the semiconductor structure can still work normally, thereby achieving better controllability of the gate.

In other embodiments, a doping concentration of the dopant ions in the first semiconductor layer 110, a doping concentration of the dopant ions in the second semiconductor layer 120 and a doping concentration of the dopant ions in the third semiconductor layer 130 may change in a step shape. That is, when each of the trenches is turned on, a different threshold voltage may be applied. For example, the first threshold voltage may be applied to turn on the trench in the first semiconductor layer 110. The second threshold voltage may be applied to turn on the trench in the second semiconductor layer 120. The third threshold voltage may be applied to turn on the trench in the third semiconductor layer 130. Therefore, three different voltages may be applied to the gate to turn on the source and the drain, thereby achieving the better controllability of the gate.

In some embodiments, the method of manufacturing a semiconductor structure further includes: A first oxide isolation layer 141 is formed between the first semiconductor layer 110 and the second semiconductor layer 120, and a second oxide isolation layer 142 is formed between the second semiconductor layer 120 and the third semiconductor layer 130. The first oxide isolation layer 141 is configured to isolate the first semiconductor layer 110 and the second semiconductor layer 120, and the second oxide isolation layer 142 is configured to isolate the second semiconductor layer 120 and the third semiconductor layer 130. Specifically, in some embodiments, the first oxide isolation layer 141 and the second oxide isolation layer 142 may be formed with a deposition process such as thermal oxidation or atomic layer deposition (ALD). In some embodiments, the first oxide isolation layer 141 and the second oxide isolation layer 142 may be made of at least one of silicon oxide, silicon nitride, silicon carbonitride or silicon oxy carbonitride.

It will be understood that, in some embodiments, the method of manufacturing a semiconductor structure further includes:

A third sacrificial layer 153 on a surface of the second semiconductor layer 120 and a fourth sacrificial layer 154 on a surface of the third semiconductor layer 130 are formed, so as to lay foundations for subsequent formation of the WL around the second semiconductor layer 120 and the third semiconductor layer.

In some embodiments, the method of manufacturing a semiconductor structure further includes: A gate cap 160 is formed on a surface of the fourth sacrificial layer 154. The gate cap 160 is configured to isolate the WL from other conductive structures in the semiconductor structure and protect the WL.

In some embodiments, before the first sacrificial layer 151 is formed, the method of manufacturing a semiconductor structure further includes: A dielectric layer 170 is formed on the surface of the substrate 100. The dielectric layer 170 is located between the first sacrificial layer 151 and the substrate 100. The dielectric layer 170 is configured to isolate the subsequently formed WL from the substrate 100. Specifically, in some embodiments, the dielectric layer 170 may be made of at least one of silicon oxide, silicon nitride, silicon carbonitride or silicon oxy carbonitride.

Figure 3:
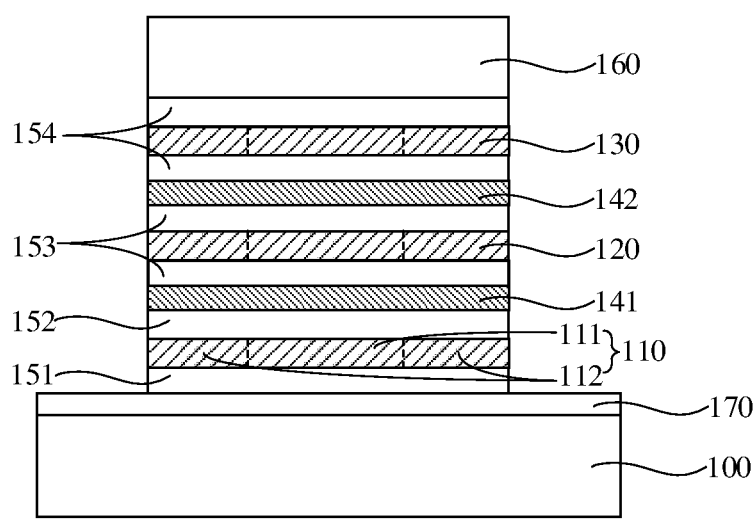
Figure 4:
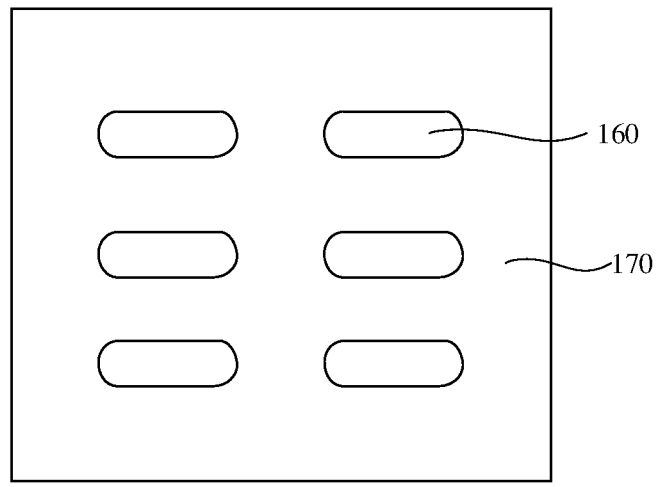

FIG. 3 is a front sectional view corresponding to formation of at least two spaced first semiconductor layers in a method of manufacturing a semiconductor structure according to an embodiment of the present disclosure. FIG. 4 is a top view corresponding to formation of at least two spaced first semiconductor layers in a method of manufacturing a semiconductor structure according to an embodiment of the present disclosure.

Referring to FIG. 3 and FIG. 4, specifically, at least two spaced first semiconductor layers 110 are specifically formed as: The first semiconductor layer 110 is patterned to form the at least two spaced first semiconductor layers 110. In some embodiments, self-aligned quadruple patterning (SAQP) or self-aligned double patterning (SADP) may be used to pattern the first basic semiconductor layer 110.

Figure 5:
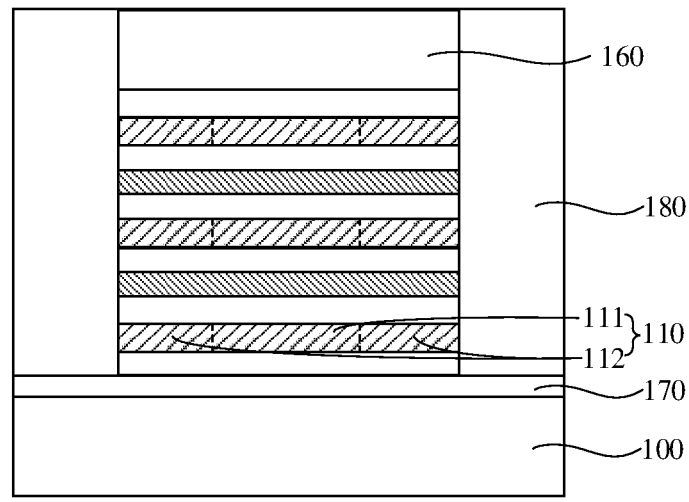
FIG. 5 to FIG. 6 each are a structural view corresponding to formation of an isolation structure in a method of manufacturing a semiconductor structure according to an embodiment of the present disclosure.
Figure 6:
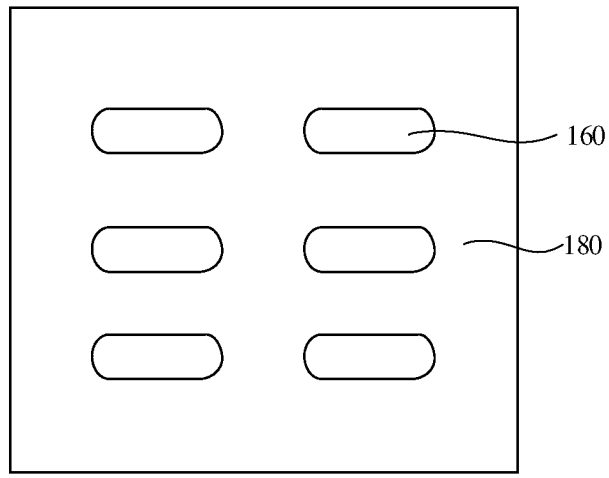

FIG. 5 is a front sectional view corresponding to formation of an isolation structure in a method of manufacturing a semiconductor structure according to an embodiment of the present disclosure. FIG. 6 is a top view corresponding to formation of an isolation structure in a method of manufacturing a semiconductor structure according to an embodiment of the present disclosure.

Referring to FIG. 5 and FIG. 6, in some embodiments, the method of manufacturing a semiconductor structure further includes: An isolation structure 180 is formed between adjacent first semiconductor layers 110. The isolation structure 180 is configured to isolate two adjacent first semiconductor layers 110. In some embodiments, the isolation structure 180 may be formed with a deposition process. Specifically, the isolation structure 180 may be made of at least one of silicon oxide, silicon nitride, silicon carbonitride or silicon oxy carbonitride.

FIG. 7 to FIG. 12 each are a structural view corresponding to formation of a WL in a method of manufacturing a semiconductor structure according to an embodiment of the present disclosure.

Referring to FIG. 7 to FIG. 12, a WL 190 is formed. The WL 190 surrounds a sidewall surface of a part of the first semiconductor layer 110 in the first trench region 111, and at least a part of a projection of a part of the first semiconductor layer 110 in the to-be-doped region 112 on a surface of the substrate 100 coincides with a projection of the WL 190 on the surface of the substrate 100. The WL 190 surrounds the sidewall surface of the part of the first semiconductor layer 110 in the first trench region 111 to form a gate-all-around (GAA) transistor, such that a three-dimensional (3D)-stacked memory device can be formed to improve the integration density of the semiconductor structure.

In some embodiments, a projection of an end surface of the to-be-doped region 112 close to the first trench region 111 on the surface of the substrate 100 may coincide with a projection of an end surface of the WL 190 close to the to-be-doped region 112 on the surface of the substrate 100, such that the doped region 112 on the two sides of the first trench region 111 can be connected by the first trench region 111.

In other embodiments, a projection of a part of the surface of the part of the first semiconductor layer 110 in the to-be-doped region 112, on the surface of the substrate 100 may coincide with a projection of a part of the WL 190 on the surface of the substrate 100. That is, the WL 190 may further surround a part of the sidewall surface of the part of the first semiconductor layer 110 in the doped region 112, to ensure that the doped region 112 on the two sides of the first trench region 111 is turned on. The WL 190 surrounds the sidewall surface of the part of the first semiconductor layer 110 in the first trench region 111, such that a contact area between the WL 190 and the surface of the part of the first semiconductor layer 110 in the first trench region 111 is larger and the trench in the semiconductor structure is longer, thereby reducing the threshold voltage of the gate and achieving the better controllability of the gate. In some embodiments, when at least two spaced first semiconductor layers 110 are provided on the surface of the substrate 100, two adjacent first semiconductor layers 110 may be connected by the WL 190.

Figure 7:
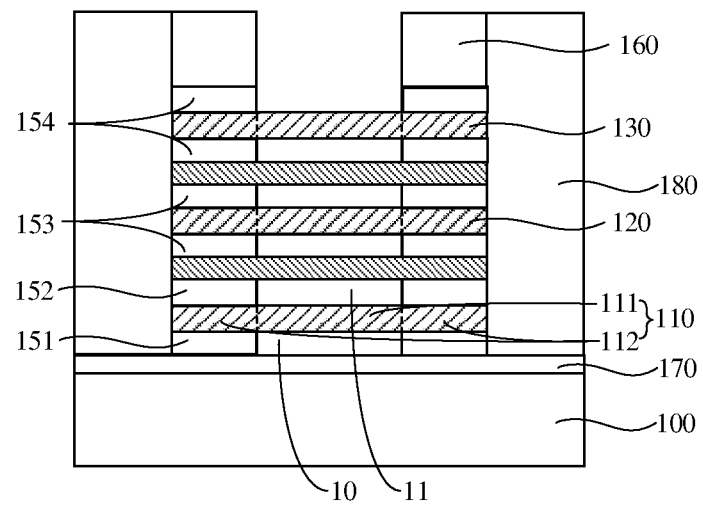
FIG. 7 to FIG. 12 each are a structural view corresponding to formation of a WL in a method of manufacturing a semiconductor structure according to an embodiment of the present disclosure.
Figure 8:
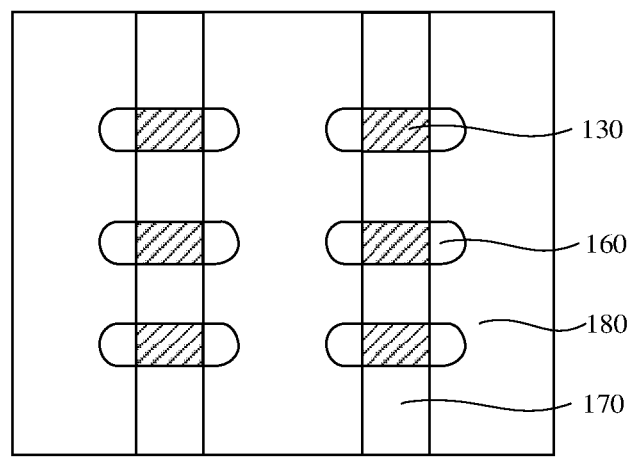

In some embodiments, the WL 190 is formed as:

FIG. 7 is a front sectional view corresponding to formation of a first air layer and a second air layer in a method of manufacturing a semiconductor structure according to an embodiment of the present disclosure. FIG. 8 is a top view corresponding to formation of a first air layer and a second air layer in a method of manufacturing a semiconductor structure according to an embodiment of the present disclosure. Referring to FIG. 7 to FIG. 8, a part of the first sacrificial layer 151 and a part of the second sacrificial layer 152 contacting the surface of the part of the first semiconductor layer 110 in the first trench region 111 are removed with an etching process to form a first air layer 10 and a second air layer 20.

In some embodiments, the etching process may be a wet etching process. As at least two spaced first semiconductor layers 110 are provided on the substrate 100 in some embodiments, parts of the first sacrificial layers 151 and parts of the second sacrificial layers 152 in each of the at least two spaced first semiconductor layers 110 may be removed synchronously in a same etching step with the wet etching process, to improve the etching efficiency. In some embodiments, either nitric acid or hydrofluoric acid may serve as an etchant solvent of the wet etching process.

Specifically, in some embodiments, the part of the first sacrificial layer 151 and the part of the second sacrificial layer 152 may be specifically removed with the etching process as: The gate cap 160 is patterned. The isolation structure 180 and the gate cap 160 are etched to expose a side of the first sacrificial layer 151 and a side of the second sacrificial layer 152 corresponding to the first trench region 111; and exposed first sacrificial layer 151 and second sacrificial layer 152 are etched to expose the surface of the part of the first semiconductor layer 110 in the first trench region 111. It will be understood that, in some embodiments, when at least two spaced first semiconductor layers 110 are provided on the substrate 100, the isolation structure 180 can be patterned. The isolation structure 180 is etched to expose the surface of the dielectric layer 170 between two adjacent first semiconductor layers 110. Therefore, during the subsequent formation of the WL 190, the two adjacent first semiconductor layers 110 are connected by the WL 190. It will be understood that, in some embodiments, when the second semiconductor layer 120 and the third semiconductor layer 130 are sequentially formed on the substrate 100, the third sacrificial layer 153 and the fourth sacrificial layer 154 are further etched, such that the WL 190 further surrounds a sidewall surface of a part of the second semiconductor layer 120 in the second trench region and a sidewall surface of a part of the third semiconductor layer 130 in the third trench region.

Figure 9:
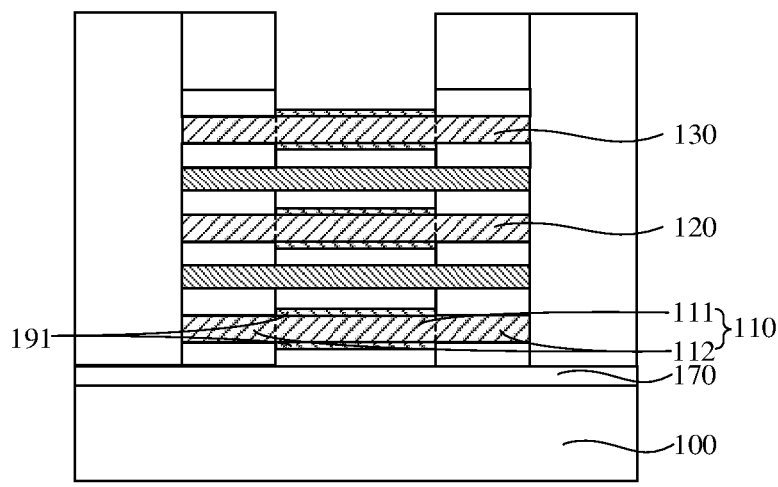
Figure 10:
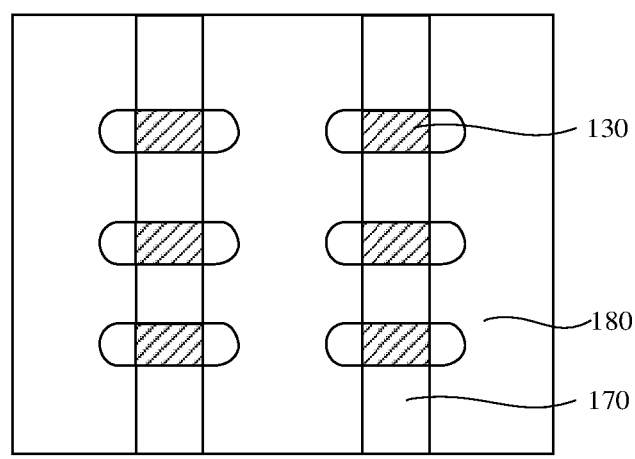

FIG. 9 is a front sectional view corresponding to formation of a gate oxide layer in a method of manufacturing a semiconductor structure according to an embodiment of the present disclosure. FIG. 10 is a top view corresponding to formation of a gate oxide layer in a method of manufacturing a semiconductor structure according to an embodiment of the present disclosure. Referring to FIG. 9 to FIG. 10, in some embodiments, before the WL 190 is formed, a gate oxide layer 191 is further formed on the surface of the part of the first semiconductor layer 110 in the first trench region 111. That is, the gate oxide layer 191 surrounds the sidewall surface of the part of the first semiconductor layer 110 in the first trench region 111. The gate oxide layer 191 is configured to isolate the WL 190 from the part of the first semiconductor layer 110 in the first trench region 111. In some embodiments, the gate oxide layer 191 further surrounds a part of the sidewall surface of the part of the first semiconductor layer 110 in the doped region. Therefore, the gate oxide layer 191 can protect the sidewall surface of the part of the first semiconductor layer 110 in the doped region, and avoid damages to the surface of the doped region in manufacture, thereby improving electrical performance of the semiconductor structure.

Specifically, in some embodiments, the gate oxide layer 191 may be formed with a deposition process. The gate oxide layer 191 may be made of at least one of silicon oxide, silicon nitride or silicon oxynitride.

Figure 11:
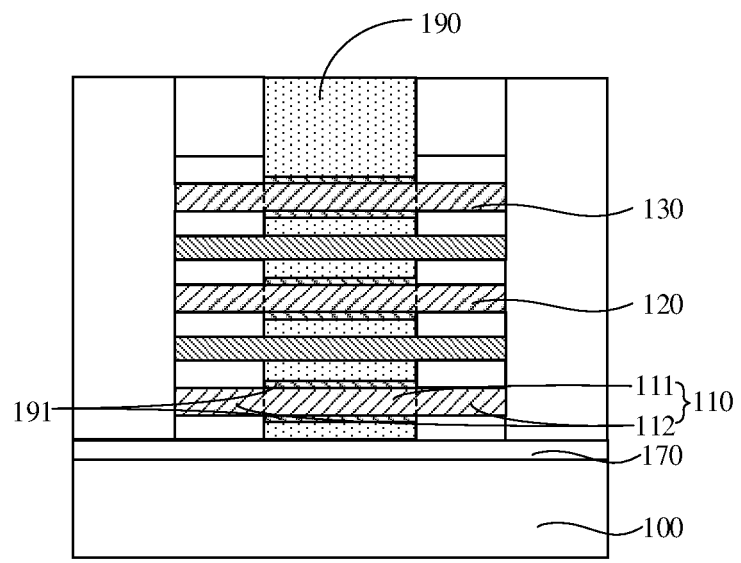
Figure 12:
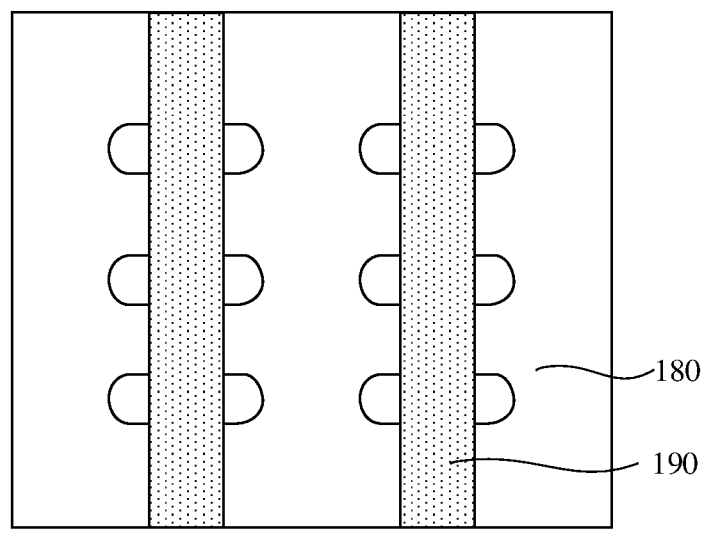

FIG. 11 is a front sectional view corresponding to formation of a WL a method of manufacturing a semiconductor structure according to an embodiment of the present disclosure. FIG. 12 is a top view corresponding to formation of a WL in a method of manufacturing a semiconductor structure according to an embodiment of the present disclosure. Referring to FIG. 11 to FIG. 12, a gate material is deposited in the first air layer 10 and the second air layer 20 to form the WL 190, the WL 190 filling the first air layer 10 and the second air layer 20. It will be understood that, in some embodiments, the WL 190 formed may be flush with a top surface of the gate cap 160 to easily control the deposition process.

Specifically, the WL 190 is formed with chemical vapor deposition (CVD), physical vapor deposition (PVD), ALD or metal organic chemical vapor deposition (MOCVD). The WL 190 may be made of at least one of cobalt, nickel, molybdenum, titanium, tungsten, tantalum or platinum.

In some embodiments, after the WL 190 is formed, a part of the WL 190 is etched back, such that a top surface of the WL 190 is flush with a bottom surface of the gate cap 160 close to the substrate 100. A gate cap 160 material is deposited on the top surface of the WL 190 to form the gate cap 160 covering the top surface of the WL 190. Therefore, the gate cap 160 can isolate and protect the gate.

FIG. 13 to FIG. 18 each are a structural view corresponding to formation of a doped region in a method of manufacturing a semiconductor structure according to an embodiment of the present disclosure.

Referring to FIG. 13 to FIG. 16, in some embodiments, the doping body portion 40 is formed as: A first through hole 30 is formed. The first through hole 30 penetrates through the first semiconductor layer 110, and the first through hole 30 exposes at least a part of the end surface of the part of the first semiconductor layer 110 in the to-be-doped region 112. The doping body portion 40 is formed in the first through hole 30, the doping body portion 40 having a first doping concentration. That is, the doping body portion 40 contacts the end surface of the first semiconductor layer 110 to horizontally dope the first semiconductor layer 110, which achieves a larger area of the doping surface than the vertical doping on the substrate 100. That is, a larger doping space is achieved to better control the doping concentration in the to-be-doped regions 112.

It will be understood that, in some embodiments, as the semiconductor structure further includes the second semiconductor layer 120 and the third semiconductor layer 130, the first through hole 30 further exposes a part of an end surface of each of the second semiconductor layer 120 and the third semiconductor layer 130 in the to-be-doped regions 112.

Figure 13:
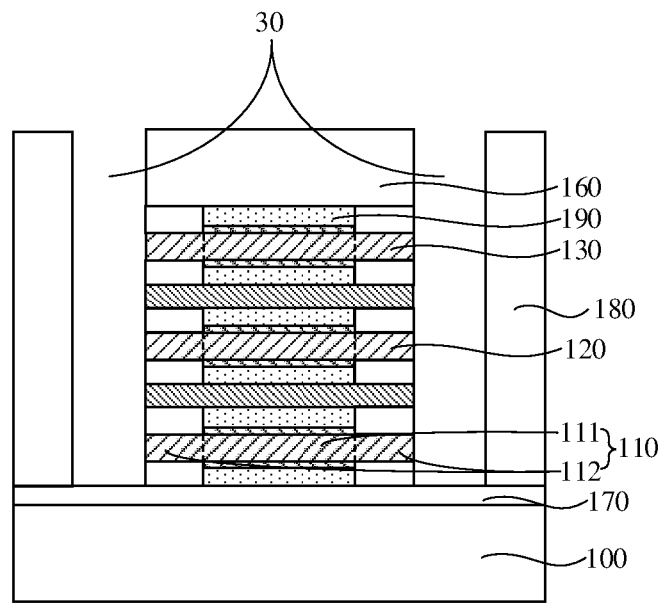
FIG. 13 to FIG. 18 each are a structural view corresponding to formation of a doped region in a method of manufacturing a semiconductor structure according to an embodiment of the present disclosure.
Figure 14:
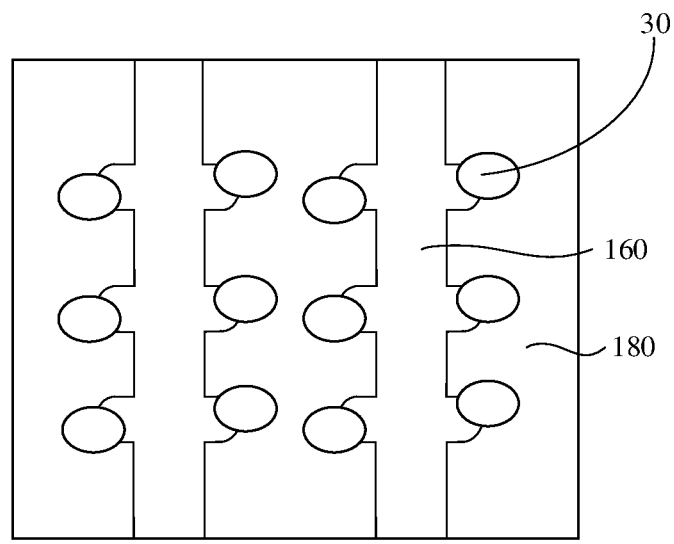

FIG. 13 is a front sectional view corresponding to formation of a first through hole in a method of manufacturing a semiconductor structure according to an embodiment of the present disclosure. FIG. 14 is a top view corresponding to formation of a first through hole in a method of manufacturing a semiconductor structure according to an embodiment of the present disclosure. Referring to FIG. 13 to FIG. 14, specifically, in some embodiments, the first through hole 30 is formed as: A part of the gate cap 160 is patterned. The gate cap 160, the fourth sacrificial layer 154, the third semiconductor layer 130, the second oxide isolation layer 142, the third sacrificial layer 153, the second semiconductor layer 120, the first oxide isolation layer 141, the second sacrificial layer 152, the first semiconductor layer 110 and the first sacrificial layer 151 are etched to expose a part of the surface of the dielectric layer 170. In some embodiments, a dry etching process may be used for etching.

Figure 15:
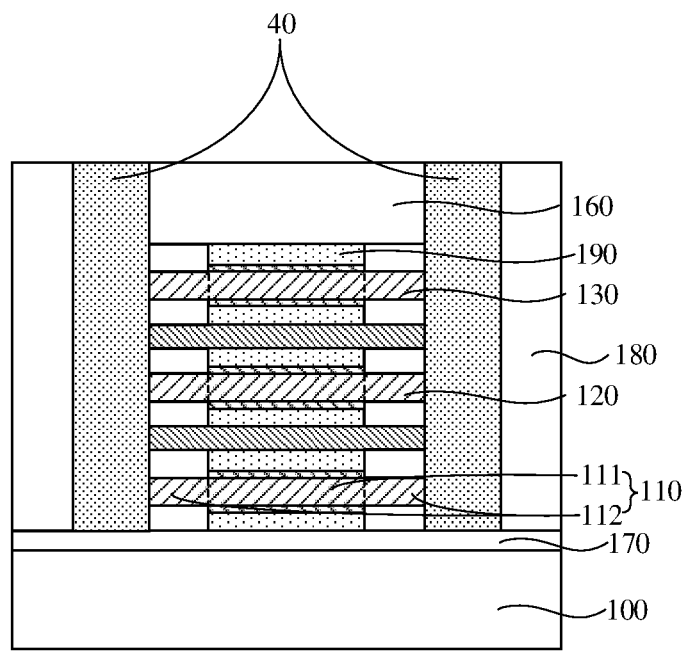
Figure 16:
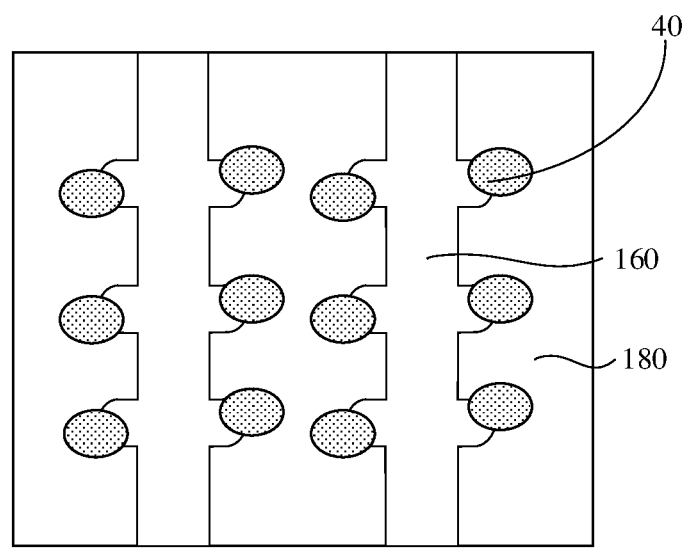

FIG. 15 is a front sectional view corresponding to formation of a doping body portion in a method of manufacturing a semiconductor structure according to an embodiment of the present disclosure. FIG. 16 is a top view corresponding to formation of a doping body portion in a method of manufacturing a semiconductor structure according to an embodiment of the present disclosure. Referring to FIG. 15 to FIG. 16, in some embodiments, the doping body portion 40 may be formed in the first through hole 30 with any one of the CVD, the PVD or the ALD.

Figure 17:
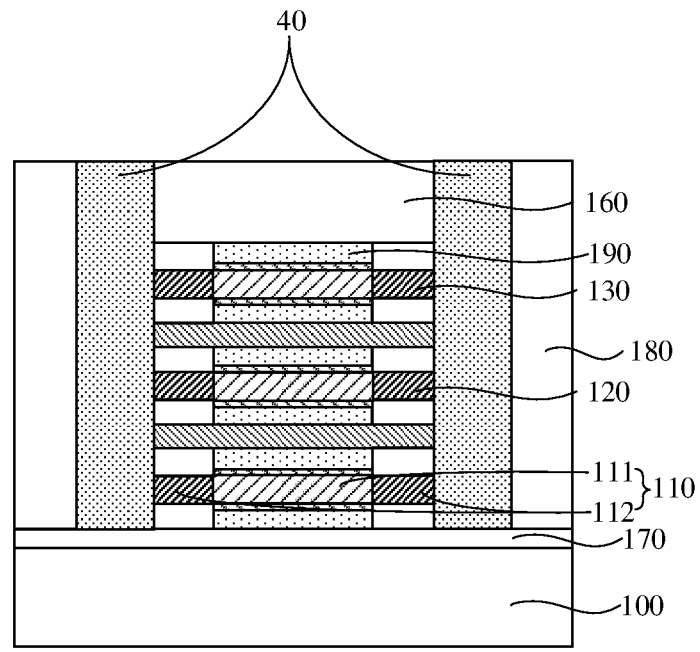
Figure 18:
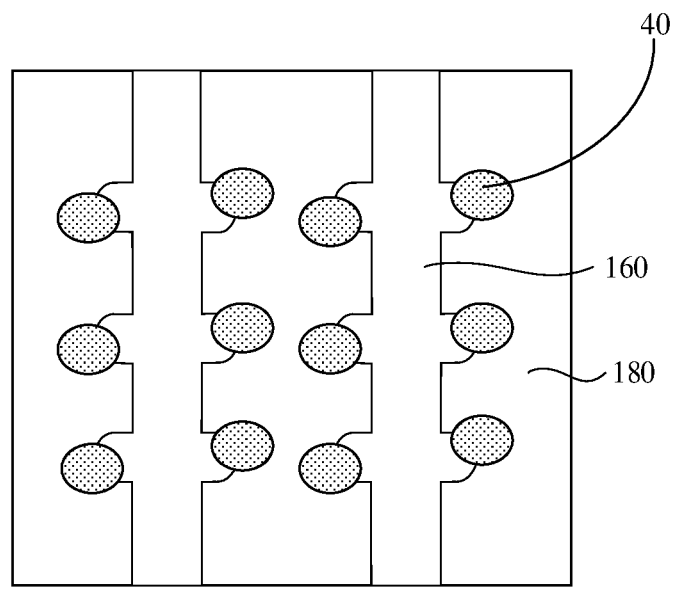
Figure 19:
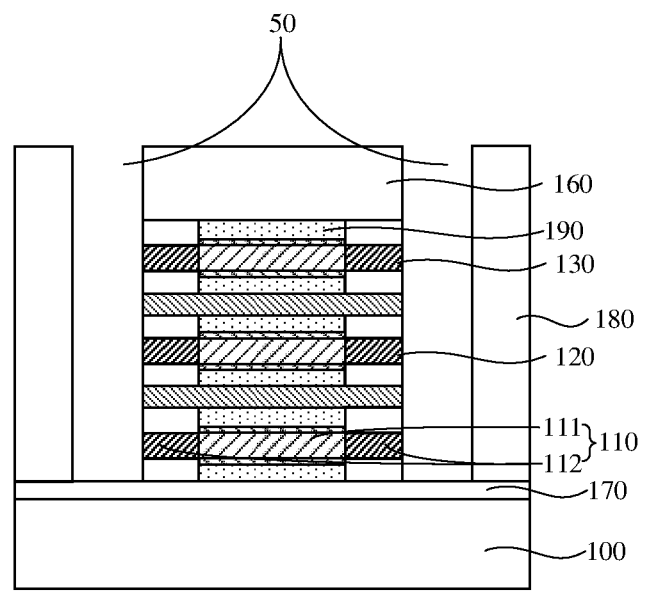
FIG. 19 to FIG. 22 each are a structural view corresponding to formation of a conductive pillar in a method of manufacturing a semiconductor structure according to an embodiment of the present disclosure.
Figure 20:
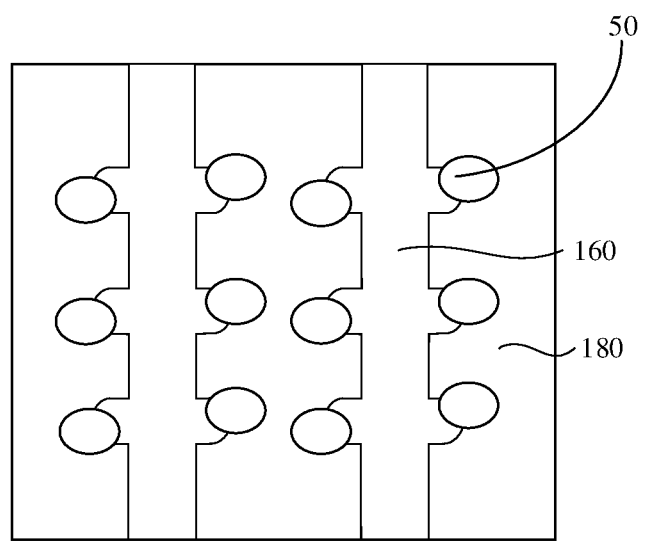

FIG. 17 is a front sectional view corresponding to formation of a doped region in a method of manufacturing a semiconductor structure according to an embodiment of the present disclosure. FIG. 18 is a top view corresponding to formation of a doped region in a method of manufacturing a semiconductor structure according to an embodiment of the present disclosure. In some embodiments, the first semiconductor layer 110 comprises second dopant ions. The second dopant ions and the first dopant ions are of different types. A concentration of the second dopant ions is a second doping concentration. The first doping concentration is greater than the first doping concentration. During diffusion, the dopant ions generally diffuse from a position at a high concentration to a position at a low concentration. As the first doping concentration is greater than the second doping concentration, there may be a concentration difference from the first dopant ions to the second dopant ions, and the first dopant ions in the doping body portion 40 may diffuse to two ends of the first semiconductor layer 110. Specifically, the first dopant ions and the second dopant ions are of the different types. In some embodiments, the first dopant ions may be P-type ions, and the second dopant ions may be N-type ions. In other embodiments, the first dopant ions may also be the N-type ions, and the second dopant ions may also be the P-type ions.

It will be understood that, in other embodiments, the first dopant ions and the second dopant ions may also be of a same type.

In some embodiments, the annealing is performed at a temperature of 500° C. to 1,000° C. Within the temperature range, the first dopant ions in the doping body portion 40 have thermal diffusion and diffuse from the doping body portion 40 to two ends of the first semiconductor layer 110, two ends of the second semiconductor layer 120 and two ends of the third semiconductor layer 130. As a result, the doped regions are formed in the first semiconductor layer 110, the second semiconductor layer 120 and the third semiconductor layer 130 to serve as the source or the drain of the semiconductor structure.

As the first dopant ions diffuse from the doping body portion 40 to the two ends of the first semiconductor layer 110, a concentration of the dopant ions in the doped region is decreased progressively along a direction that the doped region points to the first trench region 111. That is, there is a high concentration of dopant ions in the doped region away from the WL 190. As the WL 190 is far away from the doped region at the high concentration of dopant ions, the enhanced electric field when the gate is turned on has less influence on most dopant ions in the doped region, thereby avoiding current leakage of the doped region due to the strong electric field and achieving the better controllability of the gate.

FIG. 19 to FIG. 22 each are a structural view corresponding to formation of a conductive pillar in a method of manufacturing a semiconductor structure according to an embodiment of the present disclosure.

Referring to FIG. 19 to FIG. 22, in some embodiments, the method of manufacturing a semiconductor structure further includes: The doping body portion 40 is etched to form a second through hole 50. A conductive pillar 60 is formed in the second through hole 50, the conductive pillar 60 contacting a part of an end surface of the doped region away from the first trench region 111.

In some embodiments, the doping body portion 40 may be etched with either the dry etching process or the wet etching process. It will be understood that the process for forming the second through hole 50 may be the same as that for forming the first through hole 30.

Figure 21:
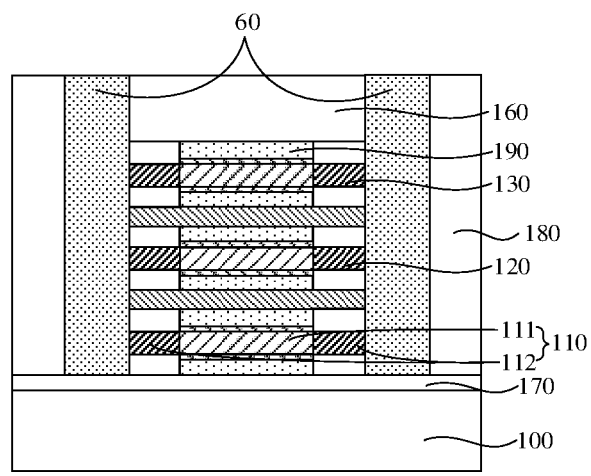
Figure 22:
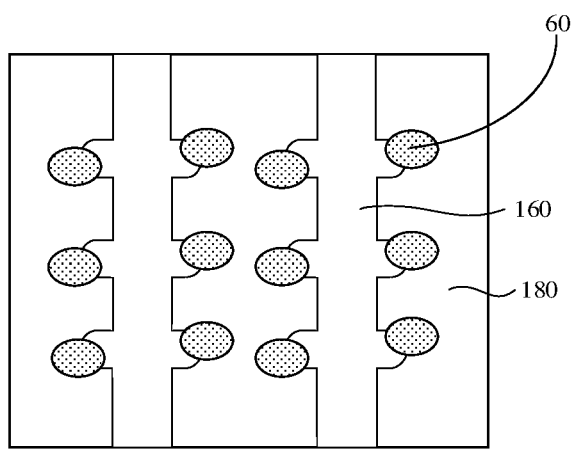

FIG. 21 is a front sectional view corresponding to formation of a conductive pillar in a method of manufacturing a semiconductor structure according to an embodiment of the present disclosure. FIG. 22 is a top view corresponding to formation of a conductive pillar in a method of manufacturing a semiconductor structure according to an embodiment of the present disclosure. The conductive pillar 60 is configured to lead out an electrical signal from the doped region. In some embodiments, the conductive pillar may be formed with a deposition process, and may be, for example, formed with any one of the CVD, the PVD, the ALD or the MOCVD. Specifically, in some embodiments, the conductive pillar may be made of at least one of cobalt, nickel, molybdenum, titanium, tungsten, tantalum or platinum.

In the method of manufacturing a semiconductor structure provided by the above embodiment, a first semiconductor layer 110 provided with a first trench region 111 and a to-be-doped region 112 on two opposite sides of the first trench region 111 is formed on a substrate 100. A WL 190 is formed. The WL 190 surrounds a sidewall surface of a part of the first semiconductor layer 110 in the first trench region 111. Therefore, the contact area between the WL 190 and the sidewall surface of the part of the first semiconductor layer 110 in the first trench region 111 is larger and the trench in the semiconductor structure is longer to reduce the threshold voltage of the gate and achieve the better controllability of the gate. A doping body portion 40 is formed. The doping body portion 40 comprises first dopant ions, and the doping body portion 40 contacts an end surface of the to-be-doped region 112 away from the first trench region 111. Annealing is performed, such that the first dopant ions diffuse to the to-be-doped region 112, the to-be-doped region 112 is converted into a doped region, and along a direction that the doped region points to the first trench region 111, a concentration of dopant ions in the doped region is decreased progressively. That is, the doping body portion 40 horizontally dopes the to-be-doped region 112 on the two sides of the first semiconductor layer 110. As the end surfaces on the two sides of the first semiconductor layer 110 are exposed to the outside, the horizontal doping on the first semiconductor layer 110 can provide a larger operating space than the vertical doping on the substrate 100 for forming the doped region, and thus the doping concentration is easily controlled and the better controllability of the gate is achieved. In addition, in the direction that the doped region points to the first trench region 111, the concentration of the dopant ions in the doped region is decreased progressively. Therefore, the enhanced electric field when the gate is turned on has less influence on most dopant ions in the doped region, thereby avoiding current leakage of the doped region due to the strong electric field and achieving the better controllability of the gate.

Accordingly, an embodiment of the present disclosure further provides a semiconductor structure. The semiconductor structure may be manufactured with the method of manufacturing a semiconductor structure provided by the above embodiment. The semiconductor structure provided by the embodiment of the present disclosure will be described below in detail with reference to the accompanying drawings.

Figure 23:
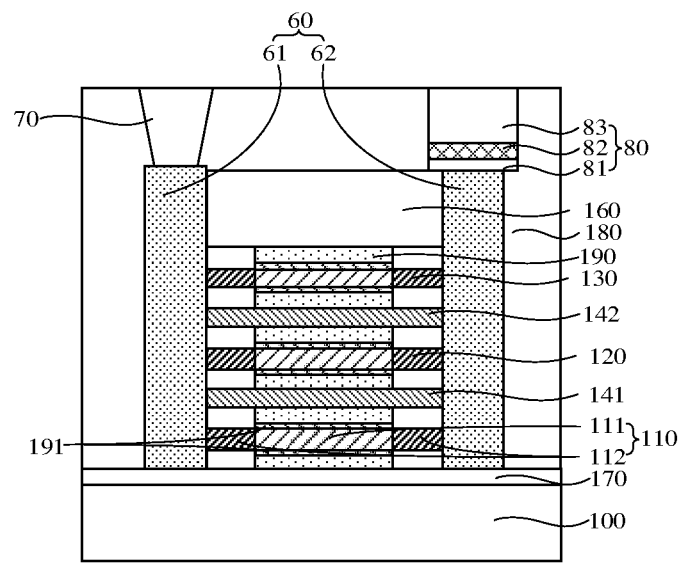
FIG. 23 is a sectional view illustrating a semiconductor structure according to an embodiment of the present disclosure.
Figure 24:
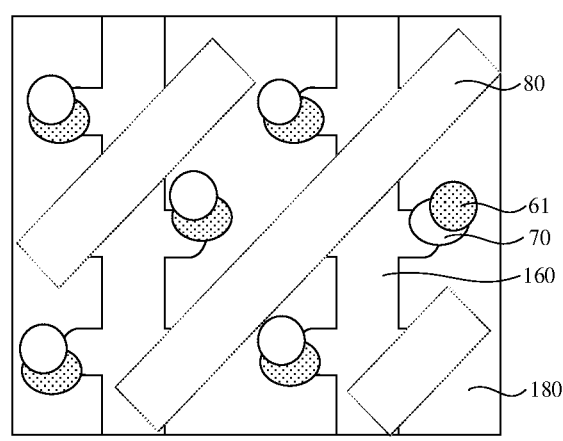
FIG. 24 is a top view illustrating a semiconductor structure according to an embodiment of the present disclosure.

FIG. 23 is a sectional view illustrating a semiconductor structure according to an embodiment of the present disclosure. FIG. 24 is a top view illustrating a semiconductor structure according to an embodiment of the present disclosure. Referring to FIG. 23 and FIG. 24, the semiconductor structure includes: a substrate 100; a first semiconductor layer 110, located on the substrate 100, and comprising a first trench region 111 and a doped region on two opposite sides of the first trench region 111, the first trench region 111 and the doped region being arranged in a direction parallel to a surface of the substrate 100, and along a direction that the doped region points to the first trench region 111, a concentration of dopant ions in the doped region being decreased progressively; and a WL 190, surrounding a sidewall surface of a part of the first semiconductor layer 110 in the first trench region 111, and at least a part of a projection of a part of the first semiconductor layer 110 in the doped region on the surface of the substrate 100 coinciding with a projection of the WL 190 on the surface of the substrate 100.

In the direction of the doped region close to the first trench region 111, the concentration of the dopant ions in the doped region is decreased progressively, namely there is a high concentration of dopant ions in the doped region away from the WL 190. As the WL 190 is far away from the doped region at the high concentration of dopant ions, the enhanced electric field when the gate is turned on has less influence on most dopant ions in the doped region, thereby avoiding current leakage of the doped region due to the strong electric field and achieving the better controllability of the gate. The WL 190 surrounds the sidewall surface of the part of the first semiconductor layer 110 in the first trench region 111, such that a contact area between the WL 190 and the sidewall surface of the part of the first semiconductor layer 110 in the first trench region 111 is larger and the trench in the semiconductor structure is longer, thereby reducing the threshold voltage of the gate and achieving the stronger controllability of the gate.

In some embodiments, a projection of an end surface of the to-be-doped region 112 close to the first trench region 111 on the surface of the substrate 100 may coincide with a projection, of an end surface of the WL 190 close to the to-be-doped region 112 on the surface of the substrate 100, such that the doped region 112 on the two sides of the first trench region 111 can be connected by the first trench region 111.

Figure 25:
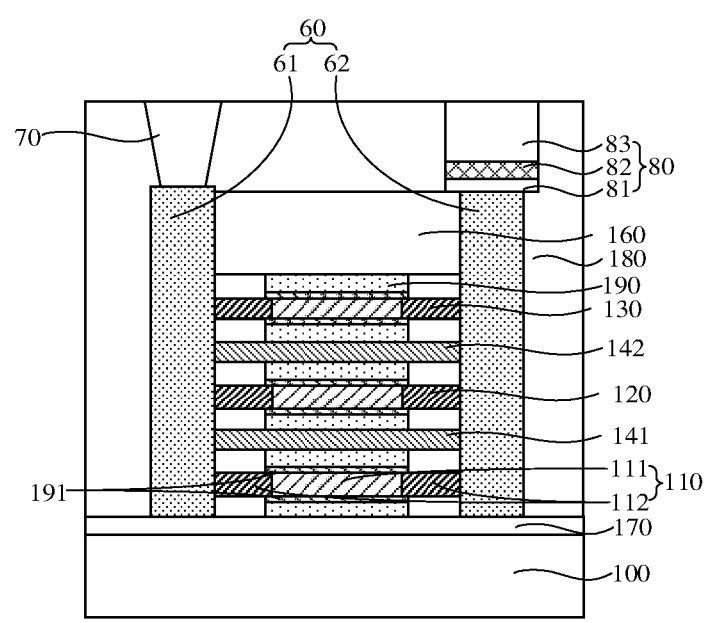
FIG. 25 is a sectional view illustrating a semiconductor structure according to another embodiment of the present disclosure.

FIG. 25 is a sectional view illustrating another semiconductor structure according to an embodiment of the present disclosure. Referring to FIG. 25, in other embodiments, a projection of a part of the surface of the part of the first semiconductor layer 110 in the to-be-doped region 112 on the surface of the substrate 100 may coincide with a projection of a part of the WL 190 on the surface of the substrate 100. That is, the WL 190 may further surround a part of the sidewall surface of the part of the first semiconductor layer 110 in the doped region 112, to ensure that the doped region 112 on the two sides of the first trench region 111 is turned on.

The substrate 100 is made of a semiconductor material. In some embodiments, the substrate 100 is made of silicon. In other embodiments, the substrate 100 may also be a germanium substrate, a germanium-silicon substrate, a silicon carbide substrate or an SOI substrate.

The first semiconductor layer 110 and the substrate 100 may be made of a same material. In some embodiments, the first preliminary semiconductor layer 110 may be made of silicon. In other embodiments, the preliminary semiconductor layer may also be made of germanium, germanium-silicon, silicon carbide substrate or SOI.

The doped region on the two sides of the first trench region 111 is formed into the source and the drain of the semiconductor structure. In some embodiments, the dopant ions in the doped region and the dopant ions in the first trench region 111 are of different types. Specifically, in some embodiments, the dopant ions in the doped region may be P-type ions, and may be, for example, at least one of boron ions, indium ions or gallium ion. The dopant ions in the first trench region 111 may be N-type ions, and may be, for example, at least one of arsenic ions, phosphorus ions or antimony ions. In other embodiments, the dopant ions in the doped region may be the N-type ions, and the dopant ions in the first trench region 111 may be the P-type ions.

It will be understood that, in other embodiments, the dopant ions in the doped region and the dopant ions in the first trench region 111 may also be of a same type.

In some embodiments, the semiconductor structure may further include: a second semiconductor layer 120 and a third semiconductor layer 130 located on an upward side of the first semiconductor layer 110 away from the substrate 100 and sequentially provided, the WL 190 surrounding a part of a sidewall surface of the second semiconductor layer 120 and a part of a sidewall surface of the third semiconductor layer 130. Specifically, in some embodiments, the second semiconductor layer 120 is provided with a second trench region and a doped region on two opposite sides of the second trench region. The third semiconductor layer 130 is provided with a third trench region and a doped region on two opposite sides of the third trench region. That is, there are three trenches in the semiconductor structure. When the voltage is applied to the gate, different trenches each function as a conductive trench to achieve the better controllability of the gate.

It will be understood that, in some embodiments, the doping concentration of the dopant ions in the first semiconductor layer 110, the doping concentration of the dopant ions in the second semiconductor layer 120 and the doping concentration of the dopant ions in the third semiconductor layer 130 may be equal. When each of the trenches is turned on, a same threshold voltage is applied to form the conductive passage to turn on the source and the drain. If one of the trenches does not work, other trenches can be turned on and the semiconductor structure can still work normally, thereby achieving better controllability of the gate.

In other embodiments, the doping concentration of the dopant ions in the first semiconductor layer 110, the doping concentration of the dopant ions in the second semiconductor layer 120 and the doping concentration of the dopant ions in the third semiconductor layer 130 may change in a step shape. That is, when each of the trenches is turned on, a different threshold voltage may be applied. For example, the first threshold voltage may be applied to turn on the trench in the first semiconductor layer 110. The second threshold voltage may be applied to turn on the trench in the second semiconductor layer 120. The third threshold voltage may be applied to turn on the trench in the third semiconductor layer 130. Therefore, three different voltages may be applied to the gate to turn on the source and the drain, thereby achieving the better controllability of the gate.

In some embodiments, the semiconductor structure may further include a gate oxide layer 191. The gate oxide layer 191 surrounds the sidewall surface of the part of the first semiconductor layer 110 in the first trench region 111, a sidewall surface of the part of the second semiconductor layer 120 in the second trench region and a sidewall surface of the part of the third semiconductor layer 130 in the third trench region. The gate oxide layer 191 is configured to isolate the WL 190 from the part of the first semiconductor layer 110 in the first trench region 111, the part of the second semiconductor layer 120 in the second trench region and the part of the third semiconductor layer 130 in the third trench region.

In some embodiments, the semiconductor structure may further include a first oxide isolation layer 141 and a second oxide isolation layer 142. The first oxide isolation layer 141 is located between the first semiconductor layer 110 and the second semiconductor layer 120, and configured to isolate the first semiconductor layer 110 and the second semiconductor layer 120. The second oxide isolation layer 142 is located between the second semiconductor layer 120 and the third semiconductor layer 130, and configured to isolate the second semiconductor layer 120 and the third semiconductor layer 130.

In some embodiments, the semiconductor structure further includes a gate cap 160. The gate cap 160 covers a top surface of the WL 190 away from the substrate 100, and is configured to isolate the WL 190 from other conductive structures in the semiconductor structure and protect the WL 190.

In some embodiments, the semiconductor structure may further include: a conductive pillar 60. The conductive pillar 60 is electrically connected to a sidewall of the part of the first semiconductor layer 110 in the doped region away from the first trench region 111, and in a direction perpendicular to the surface of the substrate 100, a distance from the conductive pillar 60 to the substrate 100 is greater than a distance from a surface of the WL 190 away from the substrate 100 to the substrate 100.

The conductive pillar 60 is configured to lead out an electrical signal from the doped region. It will be understood that, in some embodiments, when the semiconductor structure further includes a second semiconductor layer 120 and a third semiconductor layer 130, the conductive pillar 60 is further electrically connected to a sidewall of the part of the second semiconductor layer 120 in the doped region away from the second trench region and a sidewall of the part of the third semiconductor layer 130 in the doped region away from the third trench region. By doing so, the conductive pillar 60 can lead out electrical signals from doped regions in the first semiconductor layer 110, the second semiconductor layer 120 and the third semiconductor layer 130, such that the part of the first trench region 111 in the first semiconductor layer 110, the part of the second trench region in the second semiconductor layer 120 and the part of the third trench region in the third semiconductor layer 130 jointly control a same conductive device electrically connected to the conductive pillar 60 to achieve the better controllability of the gate.

In some embodiments, the conductive pillar 60 may include a first conductive pillar 61 and a second conductive pillar 62, and may further include: a capacitor structure 70, located on a surface of the first conductive pillar 61 away from the substrate 100; and a BL structure 80, located on a surface of the second conductive pillar 62 away from the substrate 100. The first conductive pillar 61 is connected to the capacitor structure 70. When the semiconductor structure is provided with the first semiconductor layer 110, the second semiconductor layer 120 and the third semiconductor layer 130, the first trench region 111 in the first semiconductor layer 110, the second trench region in the second semiconductor layer 120 and the third trench region in the third semiconductor layer 130 can jointly control the capacitor structure 70 to achieve better performance of the semiconductor structure.

Specifically, in some embodiments, the capacitor structure 70 may include a bottom electrode layer (not shown), a capacitor dielectric layer (not shown) and a top electrode layer (not shown) that are sequentially stacked along a direction away from the first conductive pillar 61. The bottom electrode layer and the top electrode layer may be made of a same material, and may be made of at least one of platinum nickel, titanium, tantalum, cobalt, polycrystalline silicon, copper, tungsten, tantalum nitride, titanium nitride or ruthenium. In other embodiments, the bottom electrode layer and the top electrode layer may also be made of different materials. The capacitor dielectric layer is made of a high dielectric constant material such as silicon oxide, tantalum oxide, hafnium oxide, zirconium oxide, niobium oxide, titanium oxide, barium oxide, strontium oxide, yttrium oxide, lanthanum oxide, praseodymium oxide or barium strontium titanate.

In some embodiments, the BL structure 80 may include a barrier layer 81, a conductive layer 82 and an insulating layer 83 that are sequentially stacked along a direction away from the second conductive pillar 62. In some embodiments, the conductive layer 82 may be made of a metal material, and may be, for example, made of any one of tungsten, copper or aluminum. In other embodiments, the conductive layer 82 may also be made of a semiconductor material, and may be, for example, made of polycrystalline silicon. The barrier layer 81 prevents diffusion between the conductive layer 82 and the second conductive pillar 62, and may be made of titanium nitride. The insulating layer 83 isolates the conductive layer 82 from other conductive devices in the semiconductor structure, and may be made of either silicon oxide or silicon nitride.

In some embodiments, there are a plurality of the first semiconductor layers 110 that are spaced apart and connected by the WL 190. Therefore, a plurality of semiconductor structures may be controlled through one WL 190, which saves a space for formation of the WL 190, minimizes the semiconductor structure, and simplifies the process for forming the WL 190.

In the semiconductor structure provided by the embodiment, a first semiconductor layer 110 is provided with a first trench region 111 and a doped region on two opposite sides of the first trench region 111. The first trench region 111 and the doped region are arranged in a direction parallel to a surface of a substrate 100. Along a direction that the doped region points to the first trench region 111, a concentration of dopant ions in the doped region is decreased progressively. A WL 190 surrounds a sidewall surface of a part of the first semiconductor layer 110 in the first trench region 111, and at least a part of a projection of a part of the first semiconductor layer 110 in the doped region on the surface of the substrate 100 coincides with a projection of the WL 190 on the surface of the substrate 100. In the direction that the doped region points to the first trench region 111, the concentration of the dopant ions in the doped region is decreased progressively, namely there is a high concentration of dopant ions in the doped region away from the WL 190. As the WL 190 is far away from the doped region at the high concentration of dopant ions, the enhanced electric field when the gate is turned on has less influence on most dopant ions in the doped region, thereby avoiding current leakage of the doped region due to the strong electric field and achieving the better controllability of the gate.

Accordingly, an embodiment of the present disclosure further provides a memory, including the semiconductor structure described above. In some embodiments, the memory may be any one of a dynamic random access memory (DRAM), a static random-access memory (SARM) or synchronous dynamic random-access memory (SDRAM). Referring to FIG. 23, in the semiconductor structure provided by the above embodiment, the to-be-doped region 112 on the two sides of the first semiconductor layer 110 is horizontally doped. In the direction that the doped region points to the first trench region 111, the concentration of the dopant ions in the doped region is decreased progressively, namely there is a high concentration of dopant ions in the doped region away from the WL 190. As the WL 190 is far away from the doped region at the high concentration of dopant ions, the enhanced electric field when the gate is turned on has less influence on most dopant ions in the doped region, thereby avoiding current leakage of the doped region due to the strong electric field and achieving the better controllability of the gate as well as better performance of the memory.

Those of ordinary skill in the art can understand that the above implementations are specific embodiments for implementing the present disclosure. In practical applications, various changes may be made to the above embodiments in terms of form and details without departing from the spirit and scope of the present disclosure. Any person skilled in the art may make changes and modifications to the embodiments without departing from the spirit and scope of the present disclosure. Therefore, the protection scope of the present disclosure should be subject to the scope defined by the claims.

The invention claimed is:

1. A method of manufacturing a semiconductor structure, comprising:
   providing a substrate;
   forming a first semiconductor layer on the substrate, wherein the first semiconductor layer comprises a first trench region and a to-be-doped region on two opposite sides of the first trench region, and the first trench region and the to-be-doped region are arranged in a direction parallel to a surface of the substrate;
   forming a word line, wherein the word line surrounds a sidewall surface of a part of the first semiconductor layer in the first trench region, and at least a part of a projection of a part of the first semiconductor layer in the to-be-doped region on the surface of the substrate coincides with a projection of the word line on the surface of the substrate;
   forming a doping body portion, wherein the doping body portion comprises first dopant ions, and the doping body portion contacts an end surface of the to-be-doped region away from the first trench region; and
   performing an annealing, such that the first dopant ions diffuse to the to-be-doped region, the to-be-doped region is converted into a doped region, and along a direction that the doped region points to the first trench region, a concentration of dopant ions in the doped region is decreased progressively.

2. The method of manufacturing a semiconductor structure according to claim 1, wherein the forming a doping body portion comprises:
   forming a first through hole, wherein the first through hole penetrates through the first semiconductor layer, and the first through hole exposes a part of an end surface of the part of the first semiconductor layer in the to-be-doped region; and
   forming the doping body portion in the first through hole, the doping body portion having a first doping concentration.

3. The method of manufacturing a semiconductor structure according to claim 1, wherein the first semiconductor layer comprises second dopant ions, a type of the second dopant ions is different from a type of the first dopant ions, a concentration of the second dopant ions is a second doping concentration, and a first doping concentration is greater than the second doping concentration.

4. The method of manufacturing a semiconductor structure according to claim 1, wherein the annealing is performed at a temperature of 500° C. to 1,000° C.

5. The method of manufacturing a semiconductor structure according to claim 1, further comprising:
   etching, with an etching process, the doping body portion, and forming a second through hole; and
   forming a conductive pillar in the second through hole, the conductive pillar contacting a part of an end surface of the doped region away from the first trench region.

6. The method of manufacturing a semiconductor structure according to claim 1, wherein the forming a word line comprises:
 forming a first sacrificial layer and a second sacrificial layer, the first sacrificial layer being located on a surface of the first semiconductor layer close to the substrate, and the second sacrificial layer being located on a surface of the first semiconductor layer away from the substrate;
 removing, with an etching process, a part of the first sacrificial layer and a part of the second sacrificial layer contacting a surface of the part of the first semiconductor layer in the first trench region, and forming a first air layer and a second air layer; and
 depositing, with a deposition process, a gate material in the first air layer and the second air layer and forming the word line, the word line filling the first air layer and the second air layer.

7. The method of manufacturing a semiconductor structure according to claim 6, further comprising: forming a gate oxide layer on the surface of the part of the first semiconductor layer in the first trench region.

8. The method of manufacturing a semiconductor structure according to claim 5, wherein the etching process is a wet etching process.

9. The method of manufacturing a semiconductor structure according to claim 1, further comprising: sequentially forming a second semiconductor layer and a third semiconductor layer on the substrate, wherein the second semiconductor layer and the third semiconductor layer are located on an upward side of the first semiconductor layer away from the substrate, the word line surrounds a part of a sidewall surface of the second semiconductor layer and a part of a sidewall surface of the third semiconductor layer, and the first semiconductor layer, the second semiconductor layer and the third semiconductor layer comprise a same type of the dopant ions.

10. The method of manufacturing a semiconductor structure according to claim 9, further comprising: forming a first oxide isolation layer between the first semiconductor layer and the second semiconductor layer, and forming a second oxide isolation layer between the second semiconductor layer and the third semiconductor layer.

11. The method of manufacturing a semiconductor structure according to claim 9, wherein a doping concentration of the dopant ions in the first semiconductor layer, a doping concentration of the dopant ions in the second semiconductor layer and a doping concentration of the dopant ions in the third semiconductor layer are equal.

12. The method of manufacturing a semiconductor structure according to claim 9, wherein a doping concentration of the dopant ions in the first semiconductor layer, a doping concentration of the dopant ions in the second semiconductor layer and a doping concentration of the dopant ions in the third semiconductor layer change in a step shape.

13. A semiconductor structure, manufactured by the method of manufacturing a semiconductor structure according to claim 1, comprising:
 a substrate;
 a first semiconductor layer, located on the substrate, and comprising a first trench region and a doped region on two opposite sides of the first trench region, the first trench region and the doped region being arranged in a direction parallel to a surface of the substrate, and along a direction that the doped region points to the first trench region, a concentration of dopant ions in the doped region being decreased progressively; and
 a word line, surrounding a sidewall surface of a part of the first semiconductor layer in the first trench region, and at least a part of a projection of a part of the first semiconductor layer in the doped region on the surface of the substrate coinciding with a projection of the word line on the surface of the substrate.

14. The semiconductor structure according to claim 13, further comprising: a second semiconductor layer and a third semiconductor layer located on an upward side of the first semiconductor layer away from the substrate and sequentially provided, the word line surrounding a part of a sidewall surface of the second semiconductor layer and a part of a sidewall surface of the third semiconductor layer.

15. The semiconductor structure according to claim 14, further comprising: a conductive pillar, wherein the conductive pillar is electrically connected to a sidewall of the part of the first semiconductor layer in the doped region away from the first trench region, and in a direction perpendicular to the surface of the substrate, a distance from the conductive pillar to the substrate is greater than a distance from a surface of the word line away from the substrate to the substrate.

16. The semiconductor structure according to claim 15, wherein the conductive pillar comprises a first conductive pillar and a second conductive pillar, and further comprises:
 a capacitor structure, located on a surface of the first conductive pillar away from the substrate; and
 a bit line structure, located on a surface of the second conductive pillar away from the substrate.

17. The semiconductor structure according to claim 13, wherein there are a plurality of the first semiconductor layers, the plurality of the first semiconductor layers are spaced apart, and the plurality of the first semiconductor layers are connected by the word line.

18. A memory, comprising the semiconductor structure according to claim 13.

* * * * *